(12) United States Patent
Dorel

(10) Patent No.: US 7,675,253 B2
(45) Date of Patent: Mar. 9, 2010

(54) LINEAR ACTUATOR USING MAGNETOSTRICTIVE POWER ELEMENT

(75) Inventor: Alain P. Dorel, Houston, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 324 days.

(21) Appl. No.: 11/733,905

(22) Filed: Apr. 11, 2007

(65) Prior Publication Data
US 2008/0111431 A1 May 15, 2008

Related U.S. Application Data

(60) Provisional application No. 60/865,884, filed on Nov. 15, 2006.

(51) Int. Cl.
*H02N 2/02* (2006.01)
*E21B 43/00* (2006.01)

(52) U.S. Cl. .................. 318/118; 310/26; 166/65.1

(58) Field of Classification Search .............. 310/26; 318/118; 166/65.1, 66.4
See application file for complete search history.

(56) References Cited

U.S. PATENT DOCUMENTS

| | | | |
|---|---|---|---|
| 3,389,274 A * | 6/1968 | Robertson | 310/328 |
| 3,952,588 A | 4/1976 | Whitten | |
| 4,291,773 A | 9/1981 | Evans | |
| 5,038,894 A | 8/1991 | Watanabe | |
| 5,332,942 A | 7/1994 | Rennex | |
| 5,382,863 A * | 1/1995 | Tyren | 310/328 |
| 5,528,029 A | 6/1996 | Chapellat | |
| 5,673,763 A | 10/1997 | Thorp | |
| 5,751,090 A * | 5/1998 | Henderson | 310/328 |
| 5,828,143 A | 10/1998 | Kotlyar | |
| 6,100,609 A | 8/2000 | Weber | |
| 6,321,845 B1 | 11/2001 | Deaton | |
| 6,433,991 B1 * | 8/2002 | Deaton et al. | 361/191 |
| 6,898,994 B2 | 5/2005 | Walton | |
| 7,161,278 B2 * | 1/2007 | Johansson | 310/328 |
| 7,227,440 B2 * | 6/2007 | Dooley | 335/281 |
| 2005/0087391 A1 | 4/2005 | Ounadjela | |

FOREIGN PATENT DOCUMENTS

EP   1252414 B1   10/2006
EP   1699093 A3   7/2007

OTHER PUBLICATIONS

Won-Jong Kim et al., Extended-Range Linear Magnetostrictive Motor with Double-Sided Three-Phase Stator, IEEE Transactions on Industry Applications vol. 38, No. 3 (May/Jun. 2002).
Bryon D. J. Snodgrass, Precision moves with magnetostriction, MachineDesign.com (Nov. 18, 2004).

* cited by examiner

*Primary Examiner*—Burton Mullins
(74) *Attorney, Agent, or Firm*—Richard A. Fagin; Daryl R. Wright; James L. Kurka

(57) ABSTRACT

A linear actuator includes a substantially cylindrical magnetostrictive element disposed in a housing. A retainer is cooperatively engaged with the housing and an exterior of the magnetostrictive element such that relaxed portions of the magnetostrictive element are frictionally retained in the retainer. An actuator rod is functionally coupled to one longitudinal end of the magnetostrictive element. A biasing device is disposed between the housing and the retainer to maintain the retainer in lateral compression. The actuator includes magnets arranged to induce peristaltic motion in the magnetostrictive element.

13 Claims, 5 Drawing Sheets

LINEAR ACTUATOR USING MAGNETOSTRICTIVE POWER ELEMENT

CROSS-REFERENCE TO RELATED APPLICATIONS

Priority is claimed from U.S. Provisional Application No. 60/865,884 filed on Nov. 15, 2006 and entitled "Cylindrical Actuator Using Magnetostrictive Element."

STATEMENT REGARDING FEDERALLY SPONSORED RESEARCH OR DEVELOPMENT

Not applicable.

BACKGROUND OF THE INVENTION

1. Field of the Invention

The invention relates generally to the field of linear actuators. More specifically, the invention relates to linear actuators using magnetostrictive elements to generate linear motion.

2. Background Art

Linear actuators have wide application in devices used in connection with wellbores drilled through the Earth's subsurface. For example, such actuators are known in the art be used to operate subsurface safety valves or other valves. Such actuators are also known in the art to be used to open and close back up arms or pads on well logging devices, or to actuate steering devices in certain drilling tools such as rotary steerable directional drilling systems.

Irrespective of the particular use, linear actuators used in connection with wellbore devices are most commonly of two types. One type includes a motor that drives a screw or worm gear. The screw or worm gear is coupled to a ball nut. Rotation of the screw is translated into linear motion of the ball nut. See, e.g., U.S. Pat. No. 6,898,994 issued to Walton.

The other type of actuator in widespread use is hydraulic. Typically, a motor drives an hydraulic pump, and pressure from the pump (which may be stored in an accumulator or similar reservoir) is selectively applied to one side or the other of a piston disposed in a cylinder. The force of the pressurized hydraulic fluid acting on the piston moves the piston along the cylinder. See, e.g., U.S. Pat. No. 5,673,763 issued to Thorp and presently owned by the assignee of the present invention.

Electric linear actuators are known in the art. See, e.g., U.S. Pat. No. 6,100,609 issued to Weber. Many electric linear actuators operate on a principle similar to the motor/ball screw combination referred to above. Typically such combination of motor and reduction gear is necessary for the actuator to produce the force required to operate the wellbore device. Electric linear motors known in the art are typically unable to produce such force absent a reduction gear.

More recently, magnetostrictive elements have been used to produce a linear actuator. See, for example, Won-Jong Kim et al., *Extended-Range Linear Magnetostrictive Motor with Double-Sided Three-Phase Stator*", IEEE Transactions on Industry Applications vol. 38, no. 3 (May/June 2002). The actuator described in the foregoing publication uses, for a power producing element, a magnetostrictive material such as one sold under the trademark ETREMA TERFENOL-D, which is a registered trademark of Edge Technologies, Inc., Ames, Iowa. The magnetostrictive element is in the form of a rectangular slab placed between two tight-fitting armatures. The armatures are subjected to a magnetic field generated by multiphase alternating current, such that the magnetic field "moves" in a manner similar to that of an electric induction motor. The magnetic field alternatingly causes magnetostriction of part of the magnetostrictive element and its consequent elongation normal to the magnetostriction, while other parts of the magnetostrictive element remain tightly held within the armatures. The friction between the stationary armatures and the uncompressed part of the magnetostrictive element provides the reaction force required to move the elongating part of magnetostrictive element against a load, causing the load to move. By "moving" the magnetic field along the armatures, the magnetostrictive element undergoes peristaltic or "inchworm" like motion, thus moving the load.

The foregoing linear actuator has been difficult to adapt to wellbore devices because of its shape.

Another type of linear actuator using a magnetostrictive material element is disclosed in Bryon D. J. Snodgrass, *Precision moves with magnetostriction*, MachineDesign.com (Nov. 18, 2004). The foregoing actuator does not have any mechanism to compensate for thermal expansion or wear of moving elements.

There continues to be a need to improved linear actuators for use in connection with wellbore devices.

SUMMARY OF THE INVENTION

One aspect of the invention is a linear actuator. A linear actuator according to this aspect of the invention includes a substantially cylindrical magnetostrictive element disposed in a housing. A retainer is cooperatively engaged with the housing and an exterior of the magnetostrictive element such that relaxed portions of the magnetostrictive element are frictionally retained in the retainer. An actuator rod is functionally coupled to one longitudinal end of the magnetostrictive element. A biasing device is disposed between the housing and the retainer to maintain the retainer in lateral compression. The actuator includes magnets arranged to induce peristaltic motion in the magnetostrictive element.

A method for operating a wellbore device according to another aspect of the invention includes applying inwardly radial biasing force to a retainer surrounding a substantially cylindrical magnetostrictive element to maintain frictional contact between the retainer and relaxed portions of the magnetostrictive element. A magnetic field is applied to the magnetostrictive element to cause peristaltic motion in the magnetostrictive element. The peristaltic motion at a longitudinal end of the magnetostrictive element is then transferred to an operating element of the wellbore device.

Other aspects and advantages of the invention will be apparent from the following description and the appended claims.

DETAILED DESCRIPTION

Figure 1:
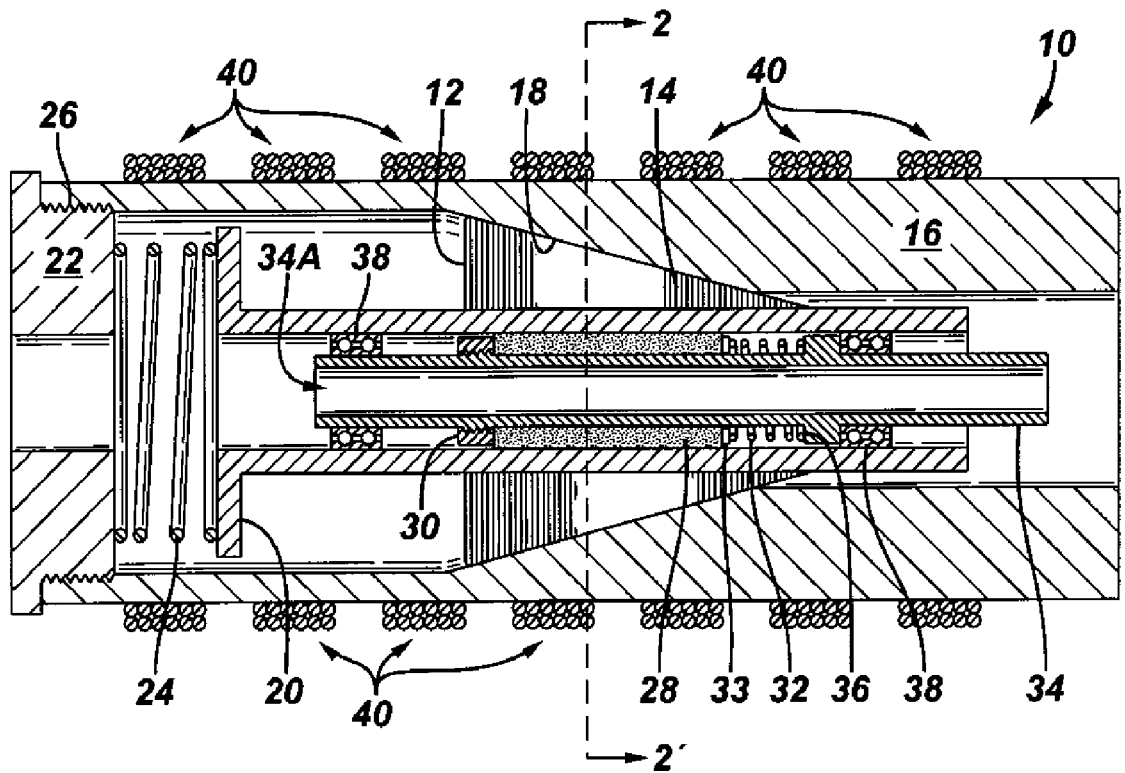
FIG. 1 is a cut away view of one example linear actuator according to the invention.

One example of a linear actuator according to the invention is shown in cut away view in FIG. 1. The actuator 10 may be disposed inside a generally cylindrical housing 16 such as may be made from a high strength, preferably non-magnetic metal or metal alloy such as monel, titanium or an alloy sold under the trademark INCONEL, which is a registered trademark of Huntington Alloys Corp., Huntington, W. Va. The housing 16 can include a tapered interior bore 18 that cooperatively engages the outer surface of correspondingly tapered wedges 14 disposed around the exterior of a magnetostrictive element retainer 12. The wedges 14 will be further explained below. The housing 16 is generally open at its longitudinal ends to enable insertion and operation of the various internal components of the actuator 10. A plurality of magnets may be disposed on an exterior surface of the housing 16. The magnets may be wire coils 40 wound so as to produce, when electrically energized, a generally longitudinally polarized, moving magnetic field inside the housing 16. The source of electric power used to energize the coils 40 will be further explained with reference to FIG. 3.

The magnetostrictive element retainer 12 (for convenience hereinafter "retainer") may also be made from high strength, non-magnetic material such as monel, titanium, or the INCONEL-brand alloy referred to above, and is disposed generally inside the housing 16 as shown in FIG. 1. As explained above, the retainer 12 may include a plurality of circumferentially spaced apart, tapered wedges 14 extending laterally outward on at least a portion of the exterior surface of the retainer 12. When the retainer 12 is longitudinally urged into the housing 16, the wedges 14 are laterally urged inwardly by cooperatively engaging the tapered interior bore 18. Longitudinal force may be provided to the retainer 12 by a spring 24 or similar biasing device cooperatively engaged between a flange 20 at one longitudinal end of the retainer 12 and a retainer nut 22 that may be threadedly engaged (see 26 in FIG. 1) with an inside surface of one longitudinal end of the housing 16. Force exerted by the spring 24 against the flange 20 urges the retainer 12 longitudinally into the housing 16 so that the tapered bore 18 exerts lateral compressive force against the wedges 14. The retainer 12 may include longitudinally extending slots (see 14A in FIG. 2) between the interior surfaces of the wedges 14 to enable lateral compression of the wedges 14 to be more freely transferred to the interior of the retainer 12.

A magnetostrictive element 28 may be disposed inside the retainer 12 as shown in FIG. 1. The magnetostrictive element 28 may be generally in the shape of an annular cylinder, enabling passage therethrough of an actuator rod or tube 34. The magnetostrictive element 28 may be made from a material known in the art as Terfenol-D and sold under the trademark ETREMA TERFENOL-D referred to in the Background section herein. Terfenol-D is preferred as a material for the magnetostrictive element 28 because of its very high degree of magnetostriction with respect to the magnitude of applied magnetic field, and the amount of force generated by its magnetostriction. The Terfenol-D material also has a curie temperature of about 380 degrees C. and is thus relatively insensitive to temperatures existing in typical wellbores. However, the exact composition of the magnetostrictive element 28 is not a limit on the scope of the present invention.

The magnetostrictive element 28 has an external diameter in its relaxed state (not subjected to a magnetic field) selected to provide a tight friction fit within the interior of the retainer 12. One longitudinal end of the magnetostrictive element 28 is cooperatively engaged with a retainer nut 30 that is threadedly engaged on a portion of the actuator rod or tube 34. The other longitudinal end of the magnetostrictive element 28 is in contact with one side of a thrust washer 33 that on its other side is in contact with one end of a coil spring 32 or similar biasing device. The spring 32 is in contact at its other end with a thrust face 36 on the exterior of the actuator rod or tube 34. The combination of retainer nut 30, spring 32 and thrust face 36 maintains the magnetostrictive element 28 in compression as it moves along the interior of the retainer 12 to longitudinally drive the actuator rod or tube 34. The actuator rod or tube 34 may be constrained to move longitudinally inside the housing 16 by journal bearings 38 or similar linear bearings disposed inside the housing 16 and external to the surface of the actuator rod or tube 34.

In operation of the actuator 10, electric current selectively passed through the coils 40 causes a portion of the magnetostrictive element 28 to laterally compress (under magnetostriction) enough so as to be able to move longitudinally within the retainer 12, and this same portion undergoes longitudinal elongation. The relaxed portions of the magnetostrictive element 28 remain frictionally fixed within the inner surface of the retainer 12. As the current through the coils 40 is selectively changed, the portions of the magnetostrictive element 28 that are laterally compressed and longitudinally elongated can be selectively changed, such that the entire magnetostrictive element 28 longitudinally translates with respect to the retainer 12 in a peristaltic or "inch worm" type motion. Because the magnetostrictive element 28 is ultimately longitudinally fixed between the retainer nut 30 and the thrust face 36, longitudinal translation of the magnetostrictive element 28 will cause corresponding longitudinal translation of the actuator rod or tube 34. Although not shown in FIG. 1, any device intended to be operated by a linear actuator may be functionally coupled to one end of the actuator tube 34.

The foregoing example includes what is described as an actuator rod or tube 34. If in the form of a tube, and as will be explained with reference to FIG. 6, the actuator rod or tube 34 may include a generally open through passage or bore 34A. In such implementations, the actuator 10 may be used, for example, to operate a wellbore valve, such as a subsurface safety valve, wherein a production tubing or similar conduit may pass through the actuator 10. In such implementations, the actuator 10 may be disposed in an annular space between the wellbore (which may be cased) and an exterior of a production tubing, See, e.g., U.S. Pat. No. 6,513,594 issued to McCalvin et al. and assigned to the assignee of the present invention for an example of one type of valve. Another type of wellbore valve will be explained below with reference to FIG. 6. It should be clearly understood that the application of the present invention is not limited to use with wellbore valves, nor must the actuated element of the actuator be in the form of a tube as in FIG. 1. Other examples may use a solid rod or similar device that may be longitudinally moved by the magnetostrictive element 28 while clearly remaining within the scope of the present invention.

Figure 2:
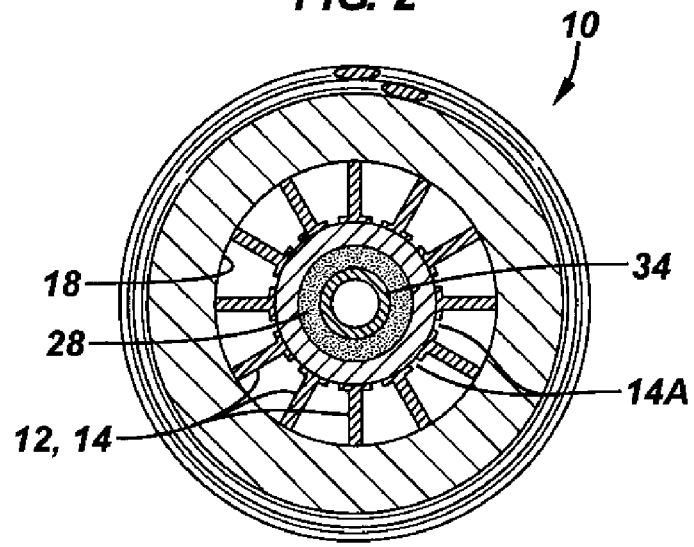
FIG. 2 is a cross section through the example actuator shown in FIG. 1.

A cross section of the actuator is shown in FIG. 2 to illustrate the cooperative arrangement of the wedges 14 with the tapered interior bore 18. A particular advantage that may be provided by the cooperative arrangement of the blades and tapered interior bore 18 is that as the retainer 12 and/or the magnetostrictive element 28 are subject to wear, thermal expansion in a wellbore and/or machining tolerances, a sufficient amount of friction can be maintained between the magnetostrictive element 28 and the retainer 12 to enable the above described translational motion of the magnetostrictive element 28 while exerting force against a load coupled to the actuator tube (34 in FIG. 1).

Figure 3:
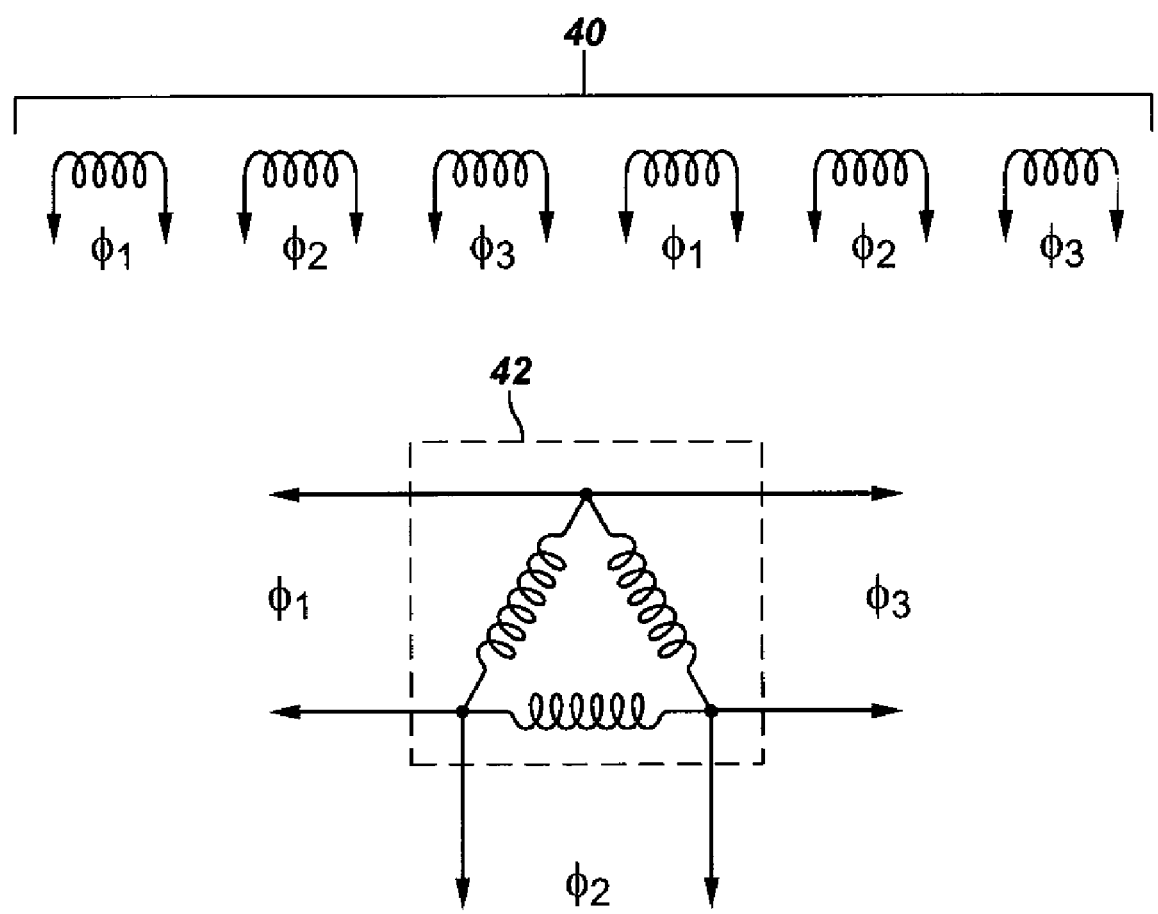
FIG. 3 shows one example of an electric power supply used to operate the actuator of FIG. 1.

One example of energizing the coils 40 is shown in FIG. 3. A multiphase alternating current source 42, which may be a three phase source, can be coupled as shown to the coils 40 such that a longitudinally "traveling" magnetic field may be exerted on the magnetostrictive element (28 in FIG. 1). As another example, the coils may have a three phase armature commutation. Each phase is made of several coils connected in series to form a number a poles. The pole pitch is preferably one half of the length of the magnetostrictive element (28 in FIG. 1). In either of the foregoing examples, the speed of motion of the actuator tube (34 in FIG. 1) may be controlled by selecting the alternating current frequency.

Figure 4:
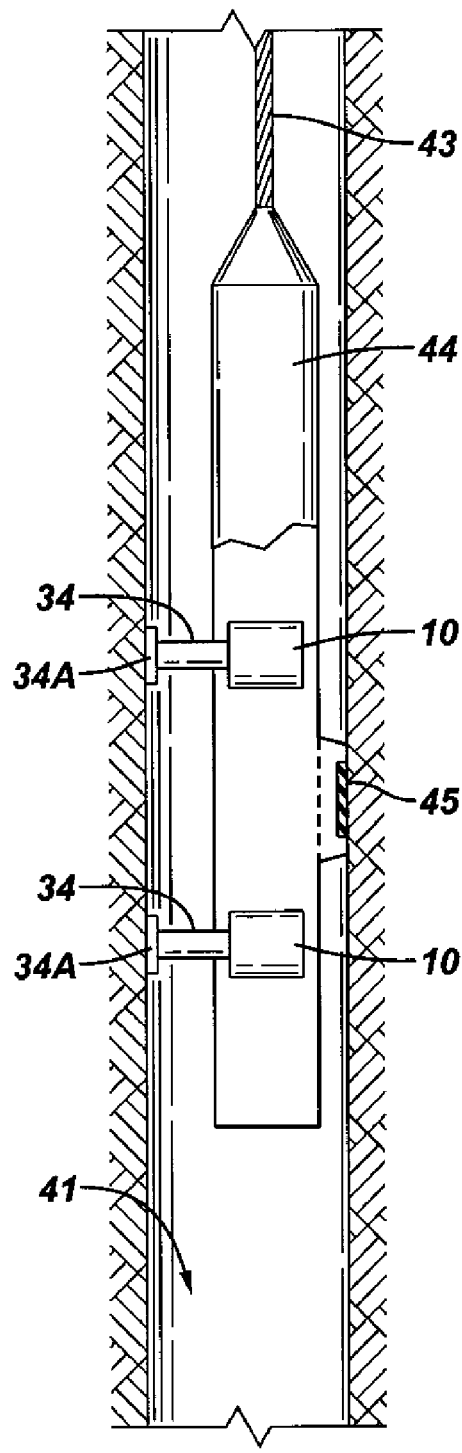
FIG. 4 shows an example of a wireline conveyed formation fluid testing instrument using an actuator according to the invention.

One example of a formation fluid testing instrument 44 that may be conveyed into a wellbore 41 at the end of an armored electrical cable 43 is shown in FIG. 4. The fluid testing instrument 44 may be of a type that engages a probe sealed by a packing element (collectively shown at 45) against a wall of the wellbore 41. The probe is thus sealingly engaged with the formation. In such instruments, it is known in the art to urge the instrument housing to one side of the wellbore to facilitate sealing engagement of the packing element with the formation. In the example shown in FIG. 4, two lines actuators 10 as explained with reference to FIGS. 1-3 may be included in the instrument 44 and arranged to extend transversely to the longitudinal axis of the instrument 44. When extended, the actuator tubes 34 engage the wall of the wellbore to urge the instrument 44 into contact with the opposite side of the wellbore 41. In such implementations, the actuator tubes 34 may include shoes or pads 34A disposed at the contacting ends thereof to limit indentation of the wellbore wall by the actuator tubes 34. One example of a formation testing instrument is described in U.S. Pat. No. 3,952,588 issued to Whitten and assigned to the assignee of the present invention.

Figure 5:
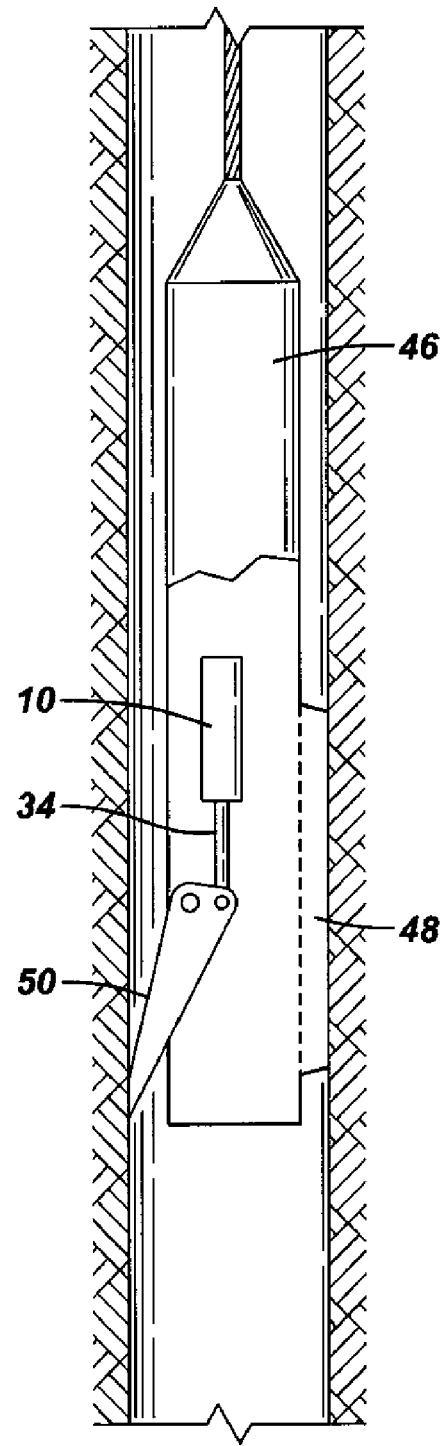
FIG. 5 shows an example of a wireline conveyed formation density measuring instrument using an actuator according to the invention.

An example of a formation density measuring instrument 46 is shown in FIG. 5. The density instrument 46 typically includes a "skid" 48 having a gamma radiation source and gamma radiation detectors (not shown separately therein) for engagement with the wall of the wellbore. An actuator 10 as explained above may have its actuator tube 34 coupled to a pivotally extending back up arm 50. Typically the actuator 10 will be arranged along the longitudinal axis of the instrument 46 such that extension of the actuator tube 34 therefrom will laterally extend the back up arm 50. See, e.g., U.S. Pat. No. 5,528,029 issued to Chappelat et al. and assigned to the assignee of the present invention for a description of a suitable back up arm linkage that may use an actuator according to the invention.

Figure 6:
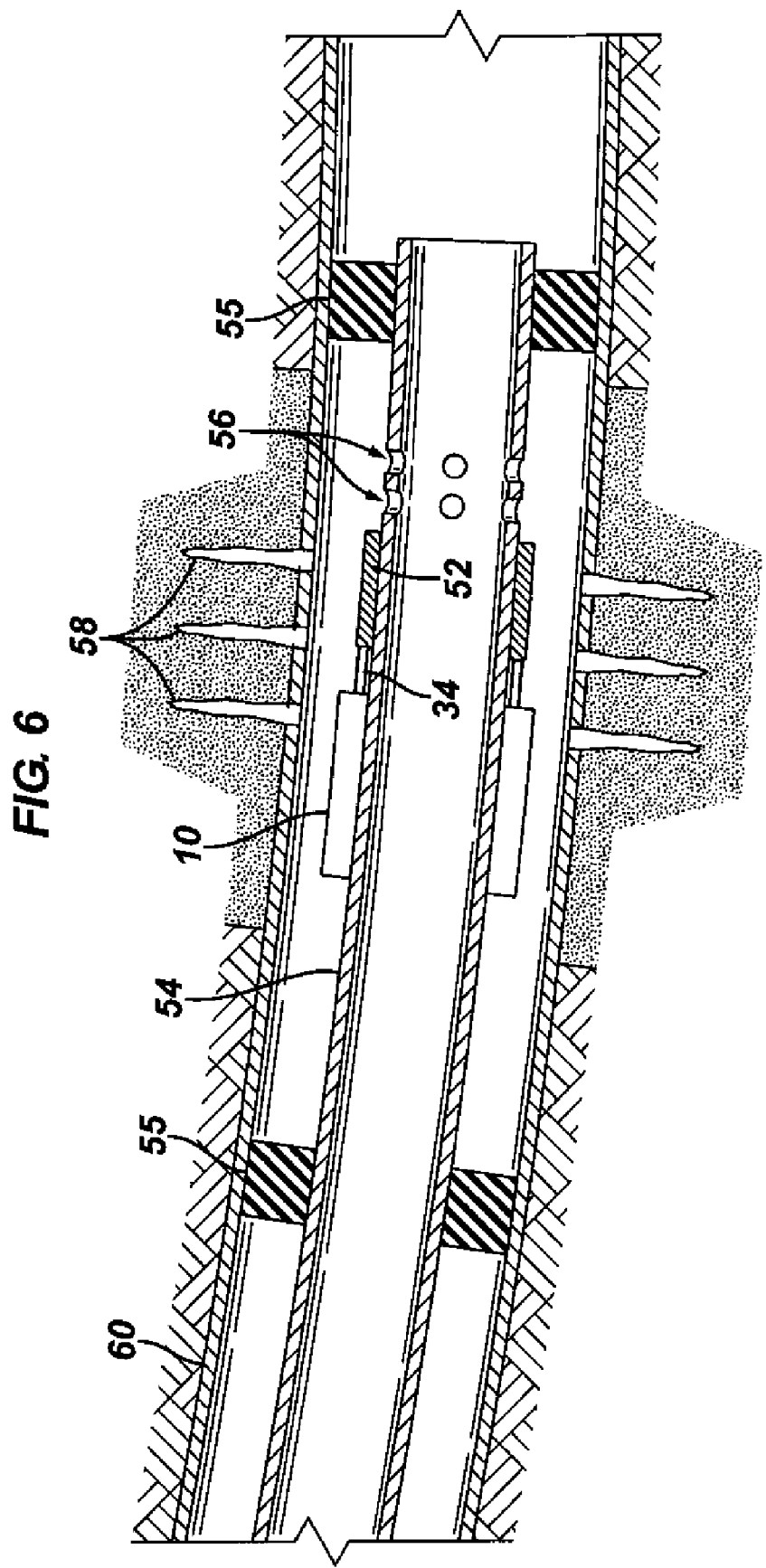
FIG. 6 shows an example of a completion valve using an actuator according to the invention.

FIG. 6 shows an example of a completion valve that may be used with an actuator according to the invention. A wellbore may have a casing 60 or similar pipe cemented therein. In a selected formation, the casing 60 may include perforations 58 to provide hydraulic communication to the interior of the casing 60 from the formation outside thereof. A production tubing 54 may extend through the interior of the casing 60 and may define a sealed annular space therein between one or more annular sealing devices ("packers") 55. The tubing 54 may itself include perforations 56 in between the packers 55 such that exposure of the tubing perforations 56 may enable fluid to enter the casing 60 and the tubing 54. The tubing perforations 56 may be selectively exposed or closed using a sliding sleeve valve 52. In the present example, an actuator 10 may be operatively coupled to the sliding sleeve valve 52, such that extension of the actuator tube 34 may move the sleeve valve 52 to cover the tubing perforations 56 thus stopping fluid entry from the casing 60 through the tubing perforations 56. Retraction of the actuator tube 34 will open the sliding sleeve valve 52.

Figure 7:
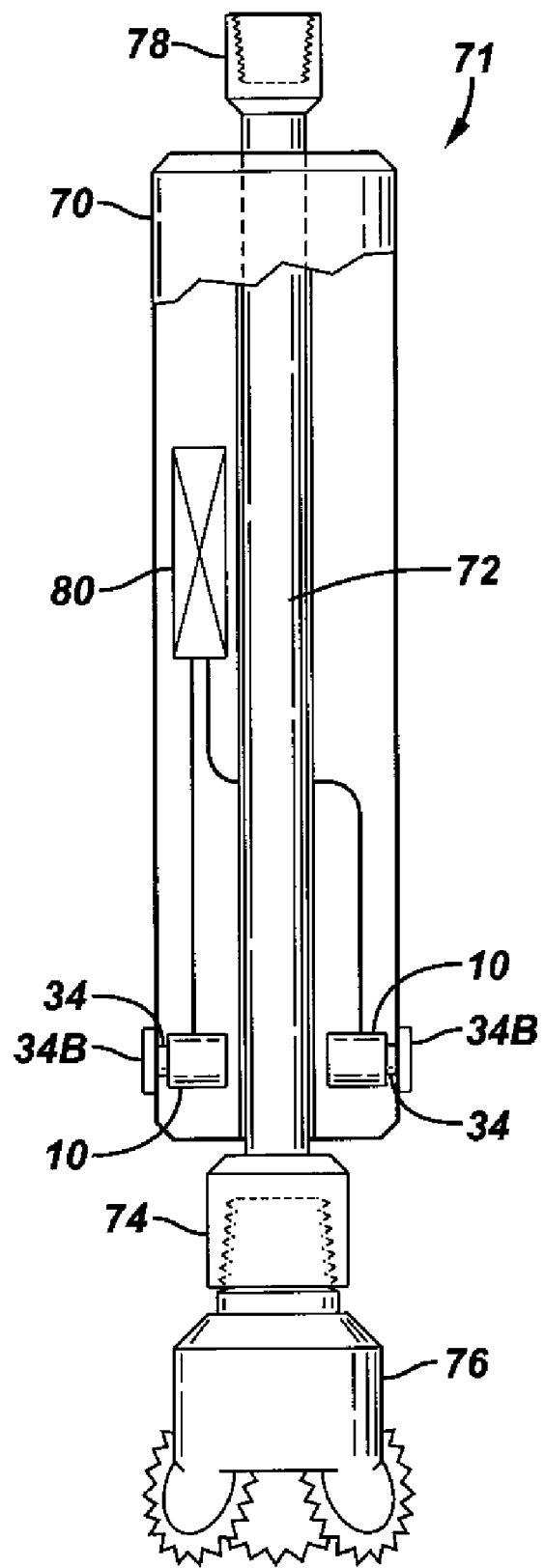
FIG. 7 shows an example of a rotary steerable directional drilling instrument that can use actuators according to the invention as a steering device.

An example of a rotary steerable directional drilling instrument that can use actuators according to the invention is shown in FIG. 7. The instrument 71 in the present example is a so-called "push the bit" instrument, but the application of an actuator according to the invention is not limited to push the bit instruments. The instrument 71 includes a drive shaft 72 that includes an upper threaded connection 78 configured to threadedly coupled to a drill string (not shown). The drive shaft 72 is rotated along with the drill string (not shown) to rotate a drill bit 76 disposed at the lower end of the instrument 71. Typically, the drive shaft 72 will include a female threaded connection ("box end") to threadedly couple to the drill bit 76 or a near-bit drilling tool (not shown). The drive shaft 72 is disposed in a housing 70 that is rotatably disposed about the exterior of the drive shaft 72. The housing includes a plurality of actuators 10 disposed at circumferentially spaced apart positions about the housing 70 and arranged such that the respective actuator rods 34 extend laterally outwardly from the center of the housing 70. Each actuator rod 34 may be covered by a pad 34B to protect the rod 34 from damage. Each actuator 10 is coupled to a directional sensing and actuator control circuit system 80. The system 80 includes sensors (not shown separately) that determine the geodetic orientation of the housing 70 and selectively extend ones of the actuators 10 to cause the instrument 71 to exert lateral force. The lateral force is selected to cause the longitudinal axis of the instrument to be oriented along a selected trajectory (and thus "steer" a wellbore along such trajectory. Rotary steerable directional drilling instruments known in the art prior to the present invention typically use hydraulic actuators to perform the same or similar function as the actuators 10 in the example instrument above.

The foregoing examples of wellbore devices are not intended to be an exhaustive list, but only a limited representation of the types of wellbore devices that may be used with actuators made according to the invention.

A linear actuator made according to the invention may have many applications in wellbore instruments and controls. Such actuators can generate substantial operating forces with relatively small active elements, can be configured to operate in many different geometries and eliminate a large number of moving parts associated with motor/ball nut and hydraulic linear actuators.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for operating a wellbore device, comprising:
  applying inwardly radial biasing force to a retainer surrounding a substantially cylindrical magnetostrictive element to maintain frictional contact between the retainer and relaxed portions of the magnetostrictive element, wherein the applying inwardly radial biasing force comprises longitudinally biasing the retainer in a housing, the retainer and housing having cooperative surfaces arranged to radially compress the retainer in response to longitudinal biasing thereof in the housing;

applying a magnetic field to the magnetostrictive element to cause peristaltic motion in the magnetostrictive element; and transferring the peristaltic motion at a longitudinal end of the magnetostrictive element to an operating element of the wellbore device.

2. The method of claim 1 wherein the applying a magnetic field comprises applying electric current to a plurality of wire coils wound longitudinally outside the retainer.

3. The method of claim 1 wherein the operating element comprises a back up pad on a formation testing instrument.

4. The method of claim 1 wherein the operating element comprises a back up arm on a density measuring instrument.

5. The method of claim 1 wherein the operating element comprises a steering element on a rotary steerable directional drilling instrument.

6. The method of claim 1 wherein the operating element comprises a wellbore sleeve valve.

7. The method of claim 1 further comprising passing a wellbore tubular longitudinally through the magnetostrictive element.

8. A method for operating a wellbore device, comprising:

applying inwardly radial biasing force to a retainer surrounding a substantially cylindrical magnetostrictive element to maintain frictional contact between the retainer and relaxed portions of the magnetostrictive element;

applying a magnetic field to the magnetostrictive element to cause peristaltic motion in the magnetostrictive element by applying electric current comprising multiphase alternating current to a plurality of wire coils wound longitudinally outside the retainer; and transferring the peristaltic motion at a longitudinal end of the magnetostrictive element to an operating element of the wellbore device.

9. The method of claim 8 wherein the operating element comprises a back up pad on a formation testing instrument.

10. The method of claim 8 wherein the operating element comprises a back up arm on a density measuring instrument.

11. The method of claim 8 wherein the operating element comprises a steering element on a rotary steerable directional drilling instrument.

12. The method of claim 8 wherein the operating element comprises a wellbore sleeve valve.

13. The method of claim 8 further comprising passing a wellbore tubular longitudinally through the magnetostrictive element.

* * * * *